United States Patent
Ishizaki et al.

(10) Patent No.: US 9,780,111 B2
(45) Date of Patent: Oct. 3, 2017

(54) SEMICONDUCTOR DEVICE AND METHOD FOR MANUFACTURING THE SAME

(71) Applicant: KABUSHIKI KAISHA TOSHIBA, Tokyo (JP)

(72) Inventors: Takeshi Ishizaki, Aichi (JP); Junichi Wada, Mie (JP); Atsuko Sakata, Mie (JP); Kei Watanabe, Mie (JP); Masayuki Kitamura, Mie (JP); Daisuke Ikeno, Mie (JP); Satoshi Wakatsuki, Mie (JP); Hirotaka Ogihara, Mie (JP); Shinya Okuda, Oita (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 14/828,830

(22) Filed: Aug. 18, 2015

(65) Prior Publication Data
US 2016/0300845 A1 Oct. 13, 2016

(30) Foreign Application Priority Data
Apr. 8, 2015 (JP) ................................ 2015-078949

(51) Int. Cl.
*H01L 29/792* (2006.01)
*H01L 27/11582* (2017.01)
*H01L 27/1157* (2017.01)

(52) U.S. Cl.
CPC .... *H01L 27/11582* (2013.01); *H01L 27/1157* (2013.01)

(58) Field of Classification Search
CPC ........... H01L 21/28282; H01L 27/2481; H01L 29/792; H01L 27/11568; H01L 29/4234; H01L 27/11582; H01L 27/1157
USPC ....................................................... 257/324
See application file for complete search history.

(56) References Cited

U.S. PATENT DOCUMENTS

| 8,476,708 B2 | 7/2013 | Fukuzumi et al. |
| 8,530,955 B2 | 9/2013 | Iino et al. |
| 2014/0097485 A1 | 4/2014 | Hattori et al. |
| 2015/0115348 A1* | 4/2015 | Nam ................. H01L 27/11582 257/324 |

\* cited by examiner

*Primary Examiner* — Thien F Tran
(74) *Attorney, Agent, or Firm* — Finnegan, Henderson, Farabow, Garrett & Dunner, L.L.P.

(57) ABSTRACT

According to one embodiment, a semiconductor device includes a substrate, a stacked body, a film having semi-conductivity or conductivity, and a memory film. The stacked body includes a plurality of metal layers, a plurality of insulating layers, and a plurality of intermediate layers stacked on a major surface of the substrate. The film extends in the stacked body in a stacking direction of the stacked body. The memory film is provided between the film and the metal layers. The metal layers are tungsten layers and the intermediate layers are tungsten nitride layers. Or the metal layers are molybdenum layers and the intermediate layers are molybdenum nitride layers.

13 Claims, 11 Drawing Sheets

US 9,780,111 B2

SEMICONDUCTOR DEVICE AND METHOD FOR MANUFACTURING THE SAME

CROSS-REFERENCE TO RELATED APPLICATION

This application is based upon and claims the benefit of priority from Japanese Patent Application No. 2015-078949, filed on Apr. 8, 2015; the entire contents of which are incorporated herein by reference.

FIELD

Embodiments described herein relate generally to a semiconductor device and a method for manufacturing the same.

BACKGROUND

A memory device having a three-dimensional structure is proposed. The memory device includes a stacked body having a plurality of electrode layers stacked with an insulating layer. A charge storage film and a semiconductor film extend in the stacked body in a stacking direction of the stacked body. When the number of stacked layers of the stacked body increases, a wafer may have large warpage due to an internal stress at the deposition of the stacked body.

DETAILED DESCRIPTION

Figure 1:
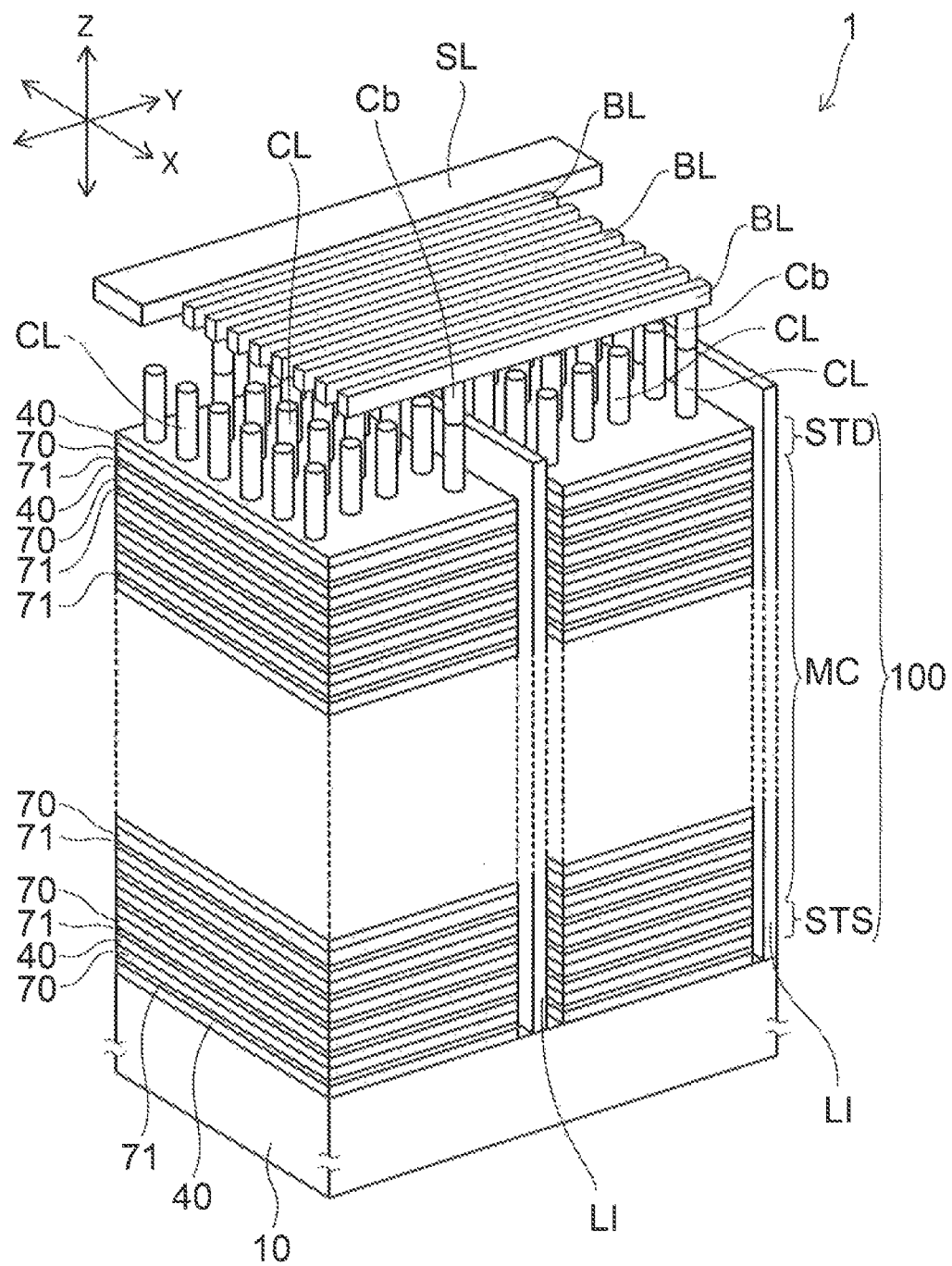
FIG. 1 is a schematic perspective view of a semiconductor device of an embodiment.

According to one embodiment, a semiconductor device includes a substrate, a stacked body, a film having semi-conductivity or conductivity, and a memory film. The stacked body includes a plurality of metal layers, a plurality of insulating layers, and a plurality of intermediate layers stacked on a major surface of the substrate. The film extends in the stacked body in a stacking direction of the stacked body. The memory film is provided between the film and the metal layers. The metal layers are tungsten layers and the intermediate layers are tungsten nitride layers. Or the metal layers are molybdenum layers and the intermediate layers are molybdenum nitride layers.

Embodiments will now be described with reference to the drawings. In the respective drawings, like members are labeled with like reference numerals.

Semiconductor devices of the embodiments are semiconductor memory devices having memory cell arrays.

FIG. 1 is a schematic perspective view of a memory cell array 1 of the embodiment.

In FIG. 1, two directions in parallel to a major surface of a substrate 10 and orthogonal to each other are an X-direction (first direction) and a Y-direction (second direction), and a direction orthogonal to both the X-direction and the Y-direction is a Z-direction (third direction, stacking direction).

The memory cell array 1 has the substrate 10, a stacked body 100 provided on the major surface of the substrate 10, a plurality of columnar parts CL, a plurality of conductive members LI, a plurality of upper interconnections provided on the stacked body 100. In FIG. 1, bit lines BL and a source layer SL are shown as the upper interconnections.

The columnar parts CL are formed in circular cylinder shapes or elliptic cylinder shapes extending in the stacked body 100 in the stacking direction (Z-direction). The conductive members LI extend in the stacking direction (Z-direction) and the X-direction of the stacked body 100 between the upper interconnections and the substrate 10. The conductive members LI separate the stacked body 100 in the Y-direction.

The columnar parts CL are provided in a staggered arrangement. Or, the plurality of columnar parts CL may be provided in a square-lattice arrangement along the X-direction and the Y-direction.

The plurality of bit lines (e.g. metal films) BL are provided on the stacked body 100. The bit lines BL are separated from each other in the X-direction and each of the bit line BL extends in the Y-direction.

The upper ends of the columnar parts CL are connected to the bit lines BL via contact parts Cb. The plurality of columnar parts CL, each of which is selected from each of areas separated in the Y-direction by the conductive members LI, are connected to one common bit line BL.

Figure 2:
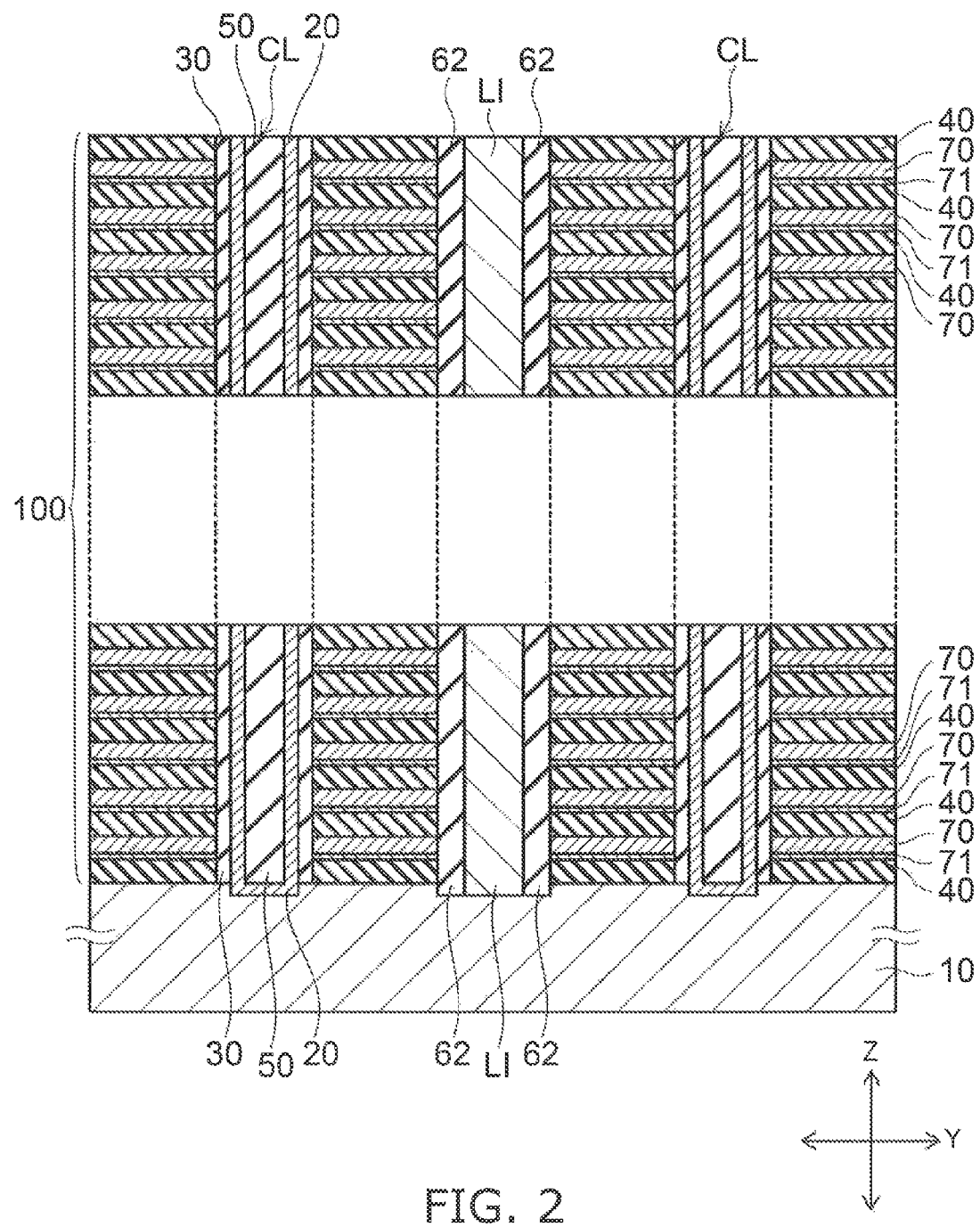
FIG. 2 is a schematic sectional view of the semiconductor device of the embodiment.

FIG. 2 is a schematic sectional view of a part in which the substrate 10 and the stacked body 100 are provided. FIG. 2 shows a section in parallel to the Y-Z plane in FIG. 1.

The stacked body 100 includes a plurality of metal layers 70, a plurality of insulating layers 40, and a plurality of intermediate layers 71. The metal layers 70, the insulating layers 40, and the intermediate layers 71 are stacked on the major surface of the substrate 10. The metal layers 70, the insulating layers 40, and the intermediate layers 71 are stacked in a direction perpendicular to the major surface of the substrate 10 (Z-direction).

The metal layers 70 are stacked in the Z-direction via the insulating layers 40 in a predetermined cycle. The intermediate layer 71 is provided between the lower surface of the metal layer 70 and the insulating layer 40 located under the metal layer 70. The intermediate layer 71 is in contact with the lower surface of the metal layer 70.

The insulating layer 40 is provided between the intermediate layer 71 and the metal layer 70 located under the intermediate layer 71. In the example shown in FIG. 2, the intermediate layer 71 is not provided between the upper surface of the metal layer 70 and the insulating layer 40 located on the metal layer 70. The insulating layer 40 is provided between the major surface of the substrate 10 and the lowermost intermediate layer 71.

The metal layer 70 contains a first metal element as a principal component and is formed substantially by a single metal element (first metal element). The first metal element contained in the metal layer 70 as the principal component includes e.g. tungsten (W), molybdenum (Mo), aluminum (Al), copper (Cu), or ruthenium (Ru). The insulating layer 40 contains e.g. silicon oxide ($SiO_2$) as a principal component.

The intermediate layer 71 is a layer of a different kind of material from that of the metal layer 70 and the insulating layer 40. Or, the intermediate layer 71 is a layer of the same kind of material as that of the metal layer 70. The intermediate layer 71 of the same kind of material as that of the metal layer 70 has conductivity. Even when the intermediate layer 71 is a layer of a different kind of material from that of the metal layer 70, the intermediate layer 71 of a metal layer has conductivity. Or, the intermediate layer 71 of a metal nitride layer may have conductivity. The intermediate layer 71 is formed as a stress relaxation layer for suppressing warpage of the stacked body 100 as will be described later. Accordingly, the intermediate layer 71 is not an element having electrical characteristics in a semiconductor device, and may be a conductive layer or insulating layer.

The plurality of intermediate layers 71 are not connected in the stacking direction of the stacked body 100, and separated from each other in the stacking direction. The intermediate layers 71 are provided in a direction along the major surface of the substrate 10, and the intermediate layers 71 are not provided in a direction along the stacking direction of the stacked body 100.

As shown in FIG. 2, the columnar part CL has a memory film 30, a semiconductor film 20, and a core insulating film 50. The semiconductor film 20 and the memory film 30 extend in pipe shapes in the stacking direction (Z-direction) in the stacked body 100. The memory film 30 is provided between the stacked body 100 and the semiconductor film 20, and surrounds the semiconductor film 20 from the outer circumference side. The core insulating film 50 is provided inside of the pipy semiconductor film 20. The upper end of the semiconductor film 20 is electrically connected to the bit line BL via the contact part Cb shown in FIG. 1.

Figure 3:
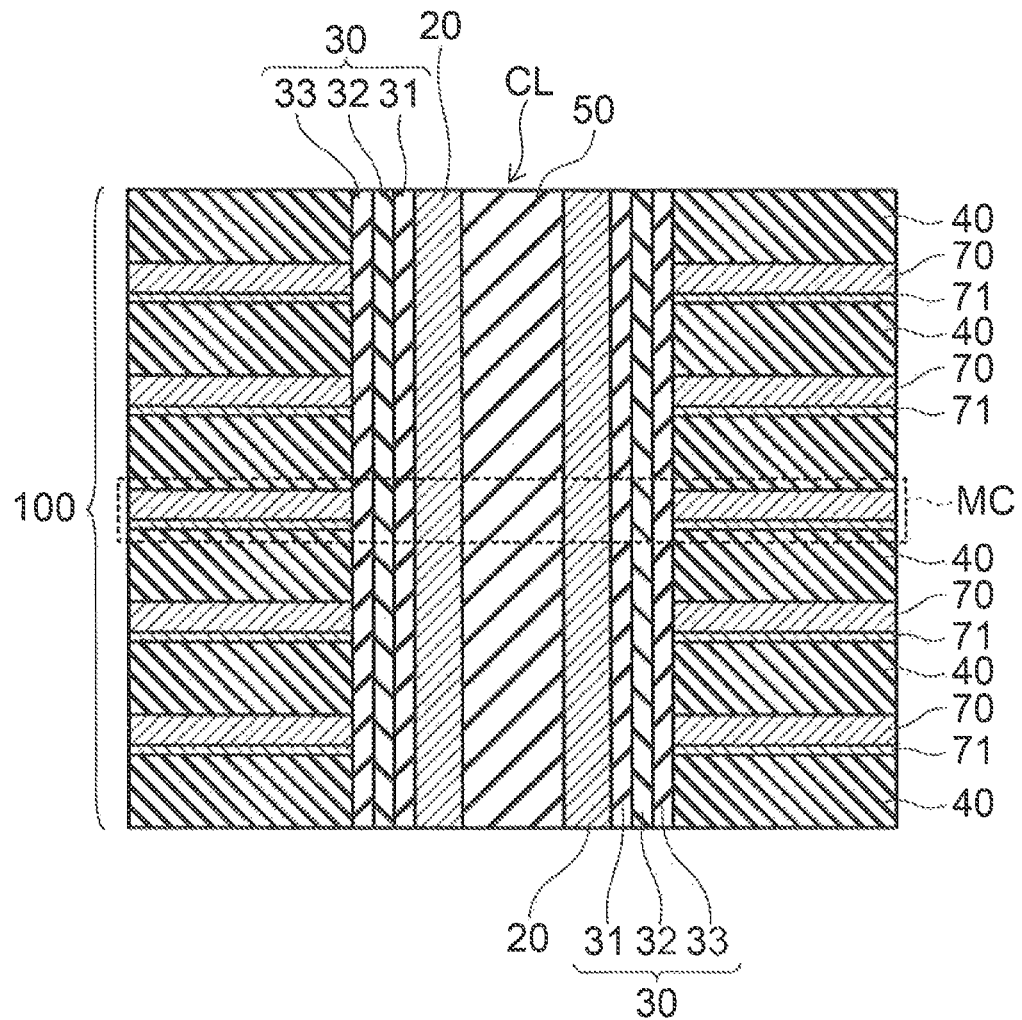
FIG. 3 is an enlarged sectional view of a part of FIG. 2.

FIG. 3 is an enlarged sectional view of a part of FIG. 2.

The memory film 30 has a block insulating film 33, a charge storage film 32, and a tunnel insulating film 31. The block insulating film 33, the charge storage film 32, and the tunnel insulating film 31, and the semiconductor film 20 are continuously provided in the stacking direction of the stacked body 100. Between the stacked body 100 and the semiconductor film 20, the block insulating film 33, the charge storage film 32, and the tunnel insulating film 31 are sequentially provided from the stacked body 100 side.

The block insulating film 33 is in contact with the metal layers 70, the tunnel insulating film 31 is in contact with the semiconductor film 20, and the charge storage film 32 is provided between the block insulating film 33 and the tunnel insulating film 31.

The semiconductor film 20, the memory film 30, and the metal layer 70 form a memory cell MC. The memory cell MC has a vertical transistor structure in which the semiconductor film 20 is surrounded by the metal layer 70 via the memory film 30.

The semiconductor film 20 functions as a channel of the memory cell MC having the vertical transistor structure, and the metal layers 70 function as control gates (control electrodes). The charge storage film 32 functions as a data memory layer that stores charge injected from the semiconductor film 20.

The semiconductor memory device of the embodiment is a nonvolatile semiconductor memory device that may electrically freely erase and write data and hold memory contents after power is turned off.

The memory cell MC is e.g. a charge-trap memory cell. The charge storage film 32 has many trap sites for trapping charge and includes e.g. a silicon nitride film.

The tunnel insulating film 31 serves as a potential barrier when charge is injected from the semiconductor film 20 into the charge storage film 32, or when the charge stored in the charge storage film 32 is diffused into the semiconductor film 20. The tunnel insulating film 31 includes e.g. a silicon oxide film. Or, the tunnel insulating film 31 includes a stacked film having a structure in which a silicon nitride film is interposed by a pair of silicon oxide films (ONO film). The tunnel insulating film 31 including the ONO film enables erase operation in the lower electric field in comparison to a single layer of the silicon oxide film.

The block insulating film 33 prevents diffusion of the charge stored in the charge storage film 32 into the metal layers 70. The block insulating film 33 includes a stacked film of e.g. a silicon oxide film and a film having a higher dielectric constant than the silicon oxide film (silicon nitride film, aluminum oxide film, hafnium oxide film, or yttrium oxide film).

As shown in FIG. 1, a drain-side select transistor STD is provided in the upper end part of the columnar part CL, and a source-side select transistor STS is provided in the lower end part. At least the lowermost metal layer 70 of the plurality of metal layers 70 functions as a control gate (control electrode) of the source-side select transistor STS. At least the uppermost metal layer 70 of the plurality of metal layers 70 functions as a control gate (control electrode) of the drain-side select transistor STD. Like the memory cell MC, the drain-side select transistor STD and the source-side select transistor STS are vertical transistors in which currents flow in the stacking direction (Z-direction) of the stacked body 100.

A plurality of memory cells MC are provided between the drain-side select transistor STD and the source-side select transistor STS. The memory cells MC, the drain-side select transistor STD, and the source-side select transistor STS are series-connected through the semiconductor film 20 and form one memory string. The memory strings are disposed in e.g. a staggered arrangement in a plane direction in parallel to the X-Y plane, and the plurality of memory cells MC are three-dimensionally provided in the X-direction, the Y-direction, and the Z-direction.

As shown in FIG. 2, insulating films 62 are provided on both side walls of the conductive member LI separating the stacked body 100 in the Y-direction. The insulating films 62 are provided between the stacked body 100 and the conductive member LI. In FIG. 1, the insulating films 62 are not shown.

The conductive member LI is a metal member containing e.g. tungsten as a principal component. The upper end of the conductive member LI is connected to the source layer SL shown in FIG. 1 provided on the stacked body 100. The lower end of the conductive member LI is in contact with the substrate 10 as shown in FIG. 2. Further, the lower end of the semiconductor film 20 is in contact with the substrate 10. The substrate 10 is a silicon substrate doped with an impurity and having conductivity. Therefore, the lower end of the semiconductor film 20 is electrically connected to the source layer SL via the substrate 10 and the conductive member LI.

Next, referring to FIGS. 4 and 5, a method for manufacturing the semiconductor memory device of the embodiment will be described.

Figure 4:
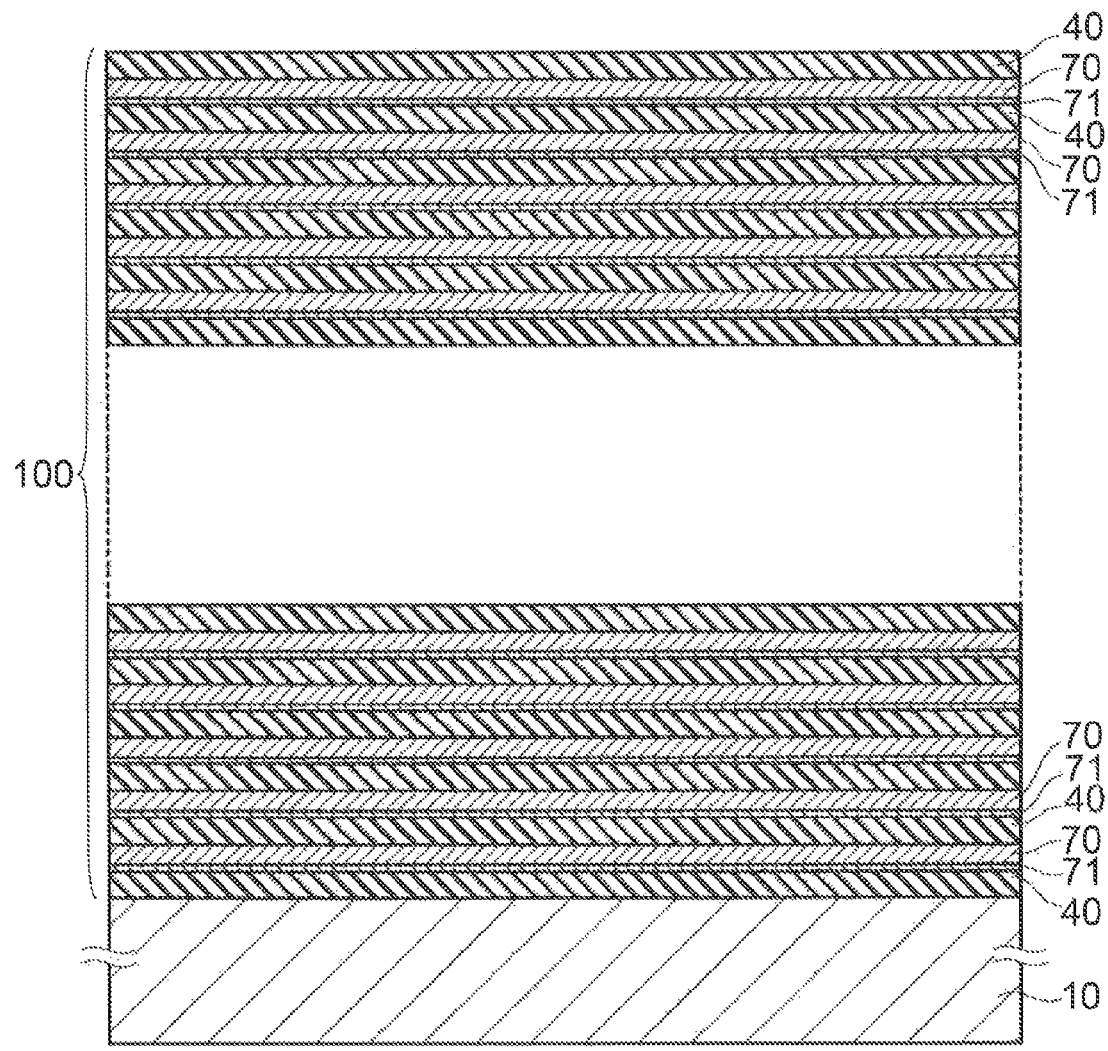
FIG. 4 is a schematic sectional view showing a method for manufacturing the semiconductor device of the embodiment.

As shown in FIG. 4, the stacked body 100 is formed on the major surface of the substrate 10. The insulating layer 40 is formed on the major surface of the substrate 10, the intermediate layer 71 is formed on the insulating layer 40, the metal layer 70 is formed on the intermediate layer 71, and the insulating layer 40 is formed on the metal layer 70 again. Subsequently, the same process of forming the intermediate layer 71 on the insulating layer 40, the metal layer 70 on the intermediate layer 71, and the insulating layer 40 on the metal layer 70 is repeated at a plurality of times.

The respective films of the stacked body 100 are formed on the substrate 10 in a wafer state before dicing into individual chips. The films may have internal stresses. The internal stresses may cause warpage of the wafer.

For instance, generally, a silicon oxide film formed by the physical vapor deposition (PVD) method or chemical vapor deposition (CVD) method often has a compressive stress of several hundreds of megapascal along the direction of the wafer surface. The compressive stress may cause warpage convex upward of the wafer with facing the rear surface downward. The rear surface of the wafer is a surface opposite to the deposition surface (major surface) of the substrate 10. On the other hand, a film having a tensile stress as a reversal of the compressive stress along the wafer surface direction may cause warpage convex downward of the wafer.

To suppress the warpage of the wafer, a combination of the metal layer 70 having the tensile stress with the insulating layer (silicon oxide film) 40 having the compressive stress is conceivable. For instance, a tungsten film and a molybdenum film often have tensile stress. However, the tungsten film and the molybdenum film formed by the PVD method or CVD method often have larger tensile stress of several gigapascal than the compressive stress (several hundreds of megapascal) of the silicon oxide film, and it is difficult to cancel out the compressive stress of the insulating layer (silicon oxide film) 40 by the tensile stress of the tungsten film or the molybdenum film. When the number of stacked metal layers 70 is larger, the tensile stress of the metal layers 70 using the tungsten films or the molybdenum films largely affects the warpage of the wafer and the warpage convex downward of the wafer is easily caused.

Note that, when the metal layer 70 is formed under control of the deposition condition such that a magnitude of the tensile stress of the metal layer (tungsten film or molybdenum film) 70 may be a magnitude of several hundreds of megapascal nearly equal to that of the insulating layer (silicon oxide film) 40, there is a tendency that film density is reduced and resistivity of the film is increased. The increase of resistivity of the metal layers 70 as the control electrodes for the memory cells MC and the select transistors STD, STS degrades device performance.

According to the embodiment, the intermediate layer 71 specialized for stress relaxation is formed as an element different from the metal layer 70 and the insulating layer 40.

The metal layer 70 gives preference to electrical characteristics over internal stress and has sufficiently low resistance as a control electrode.

On the other hand, in the intermediate layer 71, the direction and the magnitude of internal stress are appropriately controlled with preference over electrical characteristics, and, at least immediately after deposition, the intermediate layer often has a higher resistance than that of the metal layer 70. For instance, the resistivity of the intermediate layer 71 is higher than the resistivity of the metal layer 70, the film density of the intermediate layer 71 is lower than the film density of the metal layer 70, the grain size of the intermediate layer 71 is smaller than the grain size of the metal layer 70, and the thickness of the intermediate layer 71 is thinner than the thickness of the metal layer 70.

The intermediate layer 71 and the metal layer 70 are formed by e.g. the sputtering method. After the insulating layer 40 is formed, the intermediate layer 71 and the metal layer 70 are continuously formed using the same target and in the same reduced-pressure atmosphere in the chamber.

First, under a first condition, for example, a tungsten target or molybdenum target is sputtered, and thereby, a tungsten layer or molybdenum layer as the intermediate layer 71 is formed on the insulating layer 40. Subsequently, the sputtering condition is changed from the first condition to a second condition, the tungsten target or molybdenum target is sputtered, and thereby, the metal layer 70 is formed on the intermediate layer 71.

The metal layer 70 is formed as a tungsten layer or molybdenum layer having a sufficient low resistance as the control electrode, and the metal layer 70 has a tensile stress. In the first condition for formation of the intermediate layer 71, for example, a pressure in the chamber is lower and a discharge power is higher than those in the second condition. The intermediate layer 71 sputtered under the first condition may have a compressive stress as a reversal of the tensile stress of the metal layer 70.

The sputtering time for formation of the intermediate layer 71 is shorter than the sputtering time for formation of the metal layer 70, and the intermediate layer 71 is thinner than the metal layer 70. The intermediate layer 71 and the metal layer 70 are layers of the same kind (tungsten layers or molybdenum layers), and the intermediate layer 71 is provided with a function of preferentially controlling an internal stress over an electrical resistance. For instance, the film density of the intermediate layer 71 is lower than the film density of the metal layer 70, or the grain size of the intermediate layer 71 is smaller than the grain size of the metal layer 70. The intermediate layer 71 may be formed in a state in which a discharge is unstable at the start of discharging.

Figure 5:
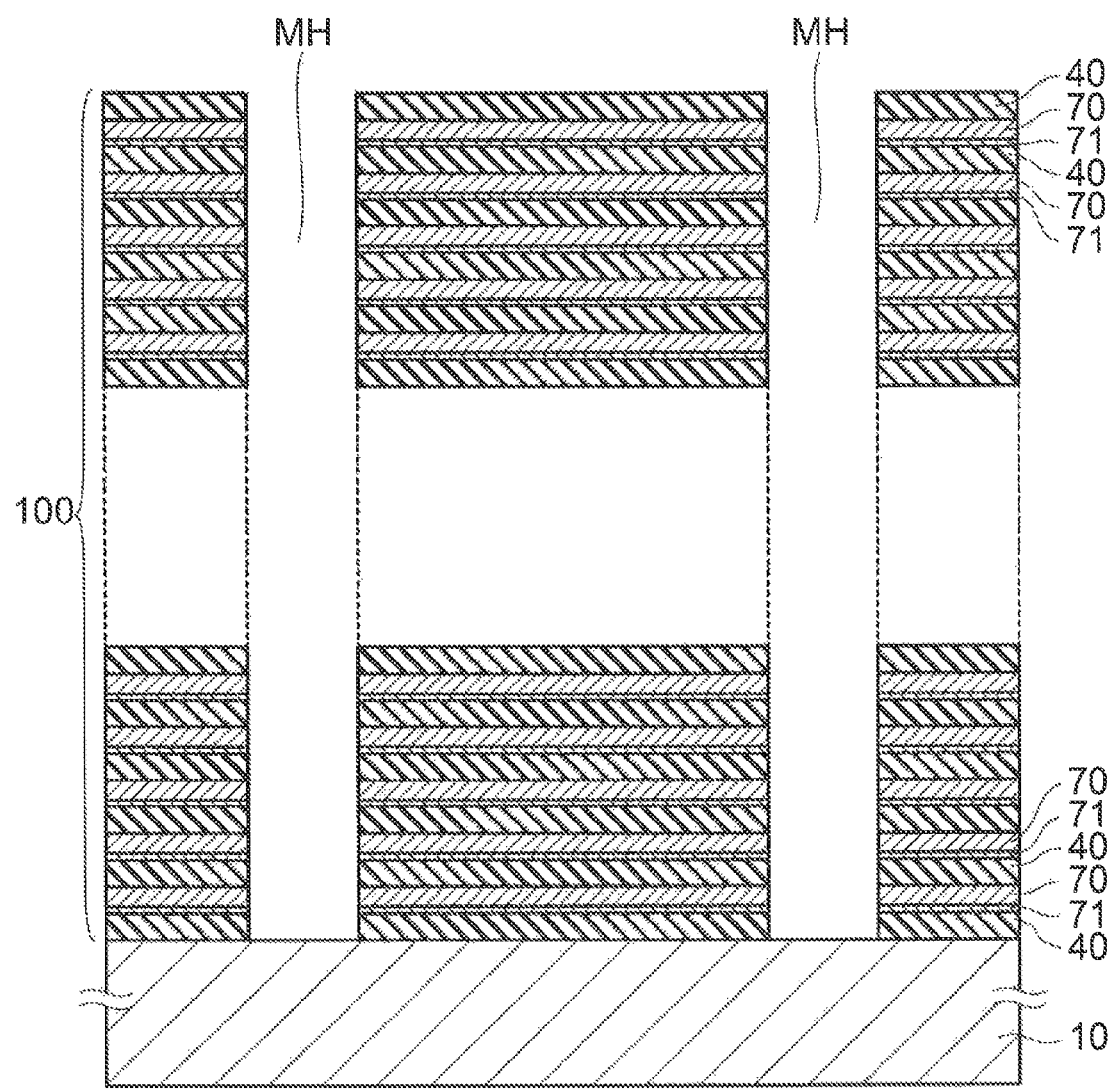
FIG. 5 is a schematic sectional view showing a method for manufacturing the semiconductor device of the embodiment.

After the stacked body 100 is formed, memory holes MH are formed as shown in FIG. 5. The memory holes MH are formed by the Reactive Ion Etching (RIE) method using a mask (not shown) formed on the stacked body 100. The memory holes MH penetrate the stacked body 100 and reach the substrate 10.

The films of the columnar part CL shown in FIG. 2 are formed in the memory hole MH. First, the memory film 30 is conformally formed on the side wall and the bottom of the memory hole MH. The memory film 30 on the bottom of the memory hole MH is removed by e.g. the RIE method, and the substrate 10 is exposed at the bottom of the memory hole MH. Then, the semiconductor film 20 is formed inside of the memory film 30 in the memory hole MH. The lower end of the semiconductor film 20 is in contact with the substrate 10 at the bottom of the memory hole MH. After the semiconductor film 20 is formed, the core insulating film 50 is formed inside the semiconductor film 20.

In a part in which the conductive member LI is provided in the stacked body 100, a slit is formed. The slit extends in the stacking direction (Z-direction) and the paper depth direction (X-direction) in FIG. 2. The slit separates the stacked body 100 in the Y-direction.

The conductive member LI is formed in the slit via the insulating film 62. The insulating film 62 is conformally formed on the side walls and the bottom of the slit. The insulating film 62 on the bottom of the slit is removed by e.g. the RIE method, and the substrate 10 is exposed at the bottom of the slit. Then, the conductive member LI is formed inside the insulating films 62 in the slit, and the lower end of the conductive member LI is in contact with the substrate 10.

After formation of the memory hole MH and the columnar part CL in the memory hole MH, the slit and the conductive member LI in the slit may be formed. Or, after formation of the slit and the conductive member LI, the memory hole MH and the columnar part CL may be formed. Or, the memory hole MH and the slit may be formed at the same time by the RIE method. Or, after formation of the slit, the insulating layers 40 may be removed by etching through the slit, and air gaps between the metal layers 70 adjacent in the vertical direction may be formed.

After forming the stacked body 100, the columnar parts CL, and the conductive members LI, the upper interconnections including the bit lines BL and the source layer SL shown in FIG. 1 are formed on the stacked body 100.

According to the embodiment, warpage and cracking of the wafer including the substrate 10 and the stacked body 100 before formation of the columnar parts CL and the conductive members LI are suppressed by the intermediate layers 71 as stress relaxation layers. Therefore, subsequent lithography and etching for formation of the memory holes MH, deposition for formation of the columnar parts CL, and wafer carriage may be preferably performed.

By heat treatment after formation of the stacked body 100, the intermediate layers 71 may be recrystallized or increased in grain size, and a resistance of the intermediate layers 71 may be made lower than a resistance of the just-deposited intermediate layers 71. In this case, the metal layers 70 and the intermediate layers 71 integrally provided using the same kind of material may function as control electrodes for the memory cells MC. The heat treatment may be heat treatment with formation of other elements after formation of the stacked body 100, or may be specially performed to reduce the resistance of the intermediate layers 71.

The time of the heat treatment is preferably at least after formation of the memory holes MH or slits in the stacked body 100. This is because, even when the compressive stress of the just-deposited intermediate layers 71 becomes smaller or reversed to tensile stress by the heat treatment, the memory holes MH and the columnar parts CL penetrating the stacked body 100 or the conductive members LI dividing the stacked body 100 relax the stress along in the plane direction of the stacked body 100 to some degree. The warpage of such stacked body 100 is not so much concerned compared to the warpage of the just-deposited stacked body 100.

The intermediate layer 71 may be formed as a layer of a different kind of material from the metal layer 70. After formation of the insulating layer 40, a metal nitride layer may be formed as the intermediate layer 71 by e.g. the reactive sputtering method using a metal target and nitrogen gas. After formation of the metal nitride layer, introduction of the nitrogen gas into the chamber is stopped or the nitrogen gas concentration in the chamber is reduced, and thereby, sputtering of the metal target is performed and the metal layer 70 is formed on the metal nitride layer (intermediate layer 71).

For instance, a tungsten nitride layer is formed as the intermediate layer 71 by the reactive sputtering method using a tungsten target and nitrogen gas, and then, a tungsten layer is formed as the metal layer 70 by sputtering of a tungsten target in the same chamber. Or, a molybdenum nitride layer is formed as the intermediate layer 71 by the reactive sputtering method using a molybdenum target and nitrogen gas, and then, a molybdenum layer is formed as the metal layer 70 by sputtering of a molybdenum target in the same chamber.

The nitrogen concentration of the intermediate layer (tungsten nitride layer or molybdenum nitride layer) 71 is 1 weight percent or more, and the nitrogen concentration of the metal layer (tungsten layer or molybdenum layer) 70 is less than 1 weight percent.

In the first condition for formation of the intermediate layer (tungsten nitride layer or molybdenum nitride layer) 71 in the sputtering method, a pressure in the chamber is lower and a discharge power is higher than those in the second condition for formation of the metal layer (tungsten layer or molybdenum layer) 70 in the sputtering method. The intermediate layer (tungsten nitride layer or molybdenum nitride layer) 71 sputtered and deposited under the first condition may have a compressive stress as a reversal of the tensile stress of the metal layer (tungsten layer or molybdenum layer) 70.

The intermediate layers 71 and the metal layers 70 may be continuously formed in the same chamber only by changing the discharge power, the kind of gas introduced into the chamber, and the pressure in the chamber. This may reduce the manufacturing time and the manufacturing cost.

The intermediate layer 71 as the metal nitride layer may be formed by the CVD method. The deposition condition of CVD is appropriately controlled, and thereby, the intermediate layer (metal nitride layer) 71 may have a compressive stress as a reversal of the tensile stress of the metal layer 70.

The metal nitride of the intermediate layer 71 is a nitride of the same first metal element as the first metal element that the metal layer 70 contains as a principal component, and thus, the process and the characteristic control are easier, and a high adhesion is provided to the intermediate layer 71 and the metal layer 70.

The intermediate layers 71 of tungsten nitride layers or molybdenum nitride layers have conductivity, and thus, may function as control electrodes for the memory cells MC and the select gates SGS, SGD with the metal layers 70.

By heat treatment after formation of the stacked body 100, nitrogen may be desorbed from the intermediate layers 71 as the metal nitride layers, and the resistance of the intermediate layers 71 may be made lower than the resistance of the just-deposited intermediate layers 71. The nitrogen concentration of the intermediate layers 71 is lower than the nitrogen concentration of the just-deposited intermediate layers 71, and thereby, the intermediate layers 71 may function as metal layers. The low-resistance intermediate layers 71 functioning as the control electrodes for the memory cells MC etc. with the metal layers 70 improves device characteristics. For instance, the nitrogen in the intermediate layers 71 is discharged through the memory holes MH to the outside of the stacked body 100. Or, the nitrogen in the intermediate layers 71 is discharged through the slits for formation of the conductive members LI to the outside of the stacked body 100.

Even when the compressive stress of the just-deposited intermediate layers 71 becomes smaller or reversed to a tensile stress by the nitrogen desorption or crystallization due to heat treatment, the memory holes MH or the slits penetrating the stacked body 100 relax the stress along in the plane direction of the stacked body 100 to some degree, and the warpage of such stacked body 100 is not so much concerned compared to the warpage of the just-deposited stacked body 100.

An amorphous layer may be formed as the intermediate layer 71. The amorphous layer has an effect of promoting increase in grain size of the metal layer 70 formed thereon, and reduces the resistance of the control electrodes for the memory cells MC and the select gates SGS, SGD.

The amorphous layer is a single-metal layer, an alloy layer that can be made non-crystalline, or a compound layer having conductivity.

The amorphous layer of the single-metal layer as the intermediate layer 71 may be a layer of the same material as the metal layer 70, or a layer of a material different from the metal layer 70.

The amorphous layer of an alloy layer or a compound layer having conductivity as the intermediate layer 71 contains, for example, two or more kinds selected from IIIB-group elements (Sc, Y, La group), IVB-group elements (Ti, Zr, Hf), VB-group elements (V, Nb, Ta), VIB-group elements (Cr, Mo, W), VIII-group elements (Fe, Ru, Os, Co, Rh, Ir, Ni, Pd, Pt), B, C, N, O, P, Si, and Ge. The amorphous layer as the intermediate layer 71 may contain perovskite-type oxide.

A broad diffraction intensity, in other words, a halo peak may be observed in the amorphous layer as the intermediate layer 71 by electron beam diffraction measurement such as Reflection High Energy Electron Diffraction (RHEED) measurement or X-ray diffraction measurement. In the diffraction measurement, diffraction lines from intermetallic compound micro-crystals due to incompleteness of the non-crystalline material may appear. The whole intermediate layer 71 may be non-crystalline, and the intermediate layer 71 may have a structure in which a part of the thin film of the crystalline material is non-crystalline. The intermediate layer 71 may be crystallized by heat treatment after formation of the memory holes MH or the slits for formation of the conductive members LI in the stacked body 100.

Depending on the selected materials, the intermediate layer 71 may have a higher adhesion to the metal layer 70 and the insulating layer 40, and a barrier function of preventing the metal in the metal layer 70 from diffusing into the insulating layer 40.

After formation of the intermediate layer 71 and the metal layer 70, the insulating layer 40 is formed on the metal layer 70 again, and the intermediate layer 71 and the metal layer 70 are formed on the insulating layer 40 in the same manner as described above. Subsequently, the process of forming the insulating layer 40, the intermediate layer 71, and the metal layer 70 is repeated at a plurality of times, and the stacked body 100 is formed on the substrate 10.

Figure 12:
FIG. 12 is a schematic side view of a stacked body having warpage.

For instance, an amount of warpage of the whole wafer including the substrate 10 and the stacked body 100 is preferably 100 μm or less to suppress exposure abnormality of lithography and carriage abnormality of the post-process. As shown in FIG. 12, the amount of warpage (H) is expressed by a height between the center part in the plane direction in the wafer and an end surface.

The magnitudes of the internal stress of at least the just-deposited respective films of the stacked body 100, the thicknesses of the respective films, and the total number of layers of the respective films preferably satisfy the following relation to suppress the amount of warpage (H) of the wafer W to be 100 or less.

(Internal stress of metal layer 70×Film thickness of metal layer 70×Total number of metal layers 70)+(Internal stress of insulating layer 40×Film thickness of insulating layer 40×Total number of insulating layers 40)+(Internal stress of intermediate layer 71×Film thickness of intermediate layer 71×Total number of intermediate layer 71) is smaller than 1700000 [MPa·nm].

Here, the internal stress of the metal layer 70 and the internal stress of the intermediate layer 71 have a reversal relationship. When the metal layer 70 has a tensile stress along the wafer plane direction, the intermediate layer 71 has a compressive stress along the wafer plane direction, and when the metal layer 70 has a compressive stress along the wafer plane direction, the intermediate layer 71 has a tensile stress along the wafer plane direction.

In the above described embodiment or the embodiments to be described later, the intermediate layer 71 has an internal stress in the opposite direction to the direction of an internal stress of the metal layer 70 at least in the just-deposited stacked body 100. Here, the direction of the internal stress shows the direction along the major surface of the substrate 10. Whether the internal stress of the intermediate layer 71 and the metal layer 70 is a tensile stress or a compressive stress can be analyzed from e.g. a lattice image of electron beam diffraction. Further, depending on the kind of film of the intermediate layer 71, the formation condition, the magnitude of the internal stress provided at deposition, the intermediate layer 71 having an internal stress in the opposite direction to that of the metal layer 70 can be analyzed after the memory cell array 1 is formed.

Figure 6:
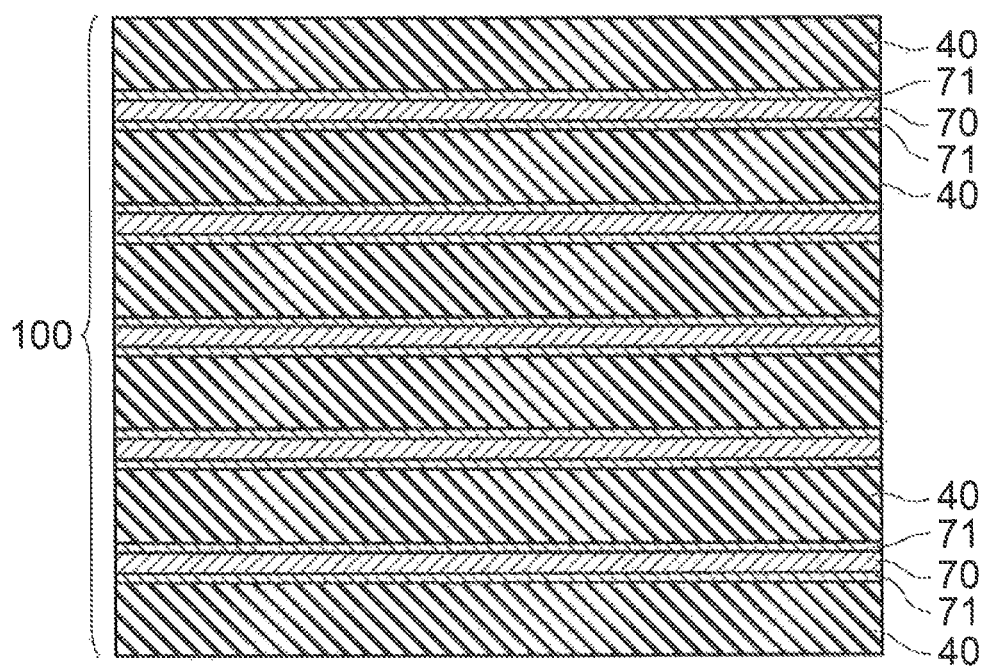
FIG. 6 is a schematic sectional view of a part of a stacked body of the semiconductor device of the embodiment.

FIG. 6 is a schematic sectional view showing another specific example of a part of the stacked body 100.

As shown in FIG. 6, the above described intermediate layer 71 may be provided between the upper surface of the metal layer 70 and the insulating layer 40 above the metal layer 70. In the example shown in FIG. 6, the intermediate layers 71 are in contact with the upper and lower surfaces of the metal layer 70.

Also, in the structure of FIG. 6, (Internal stress of metal layer 70×Film thickness of metal layer 70×Total number of metal layers 70)+(Internal stress of insulating layer 40×Film thickness of insulating layer 40×Total number of insulating layers 40)+(Internal stress of intermediate layer 71×Film thickness of intermediate layer 71×Total number of intermediate layer 71) is preferably smaller than 1700000 [MPa·nm] to suppress the amount of warpage (H) of the wafer W to be 100 μm or less.

Figure 7A:
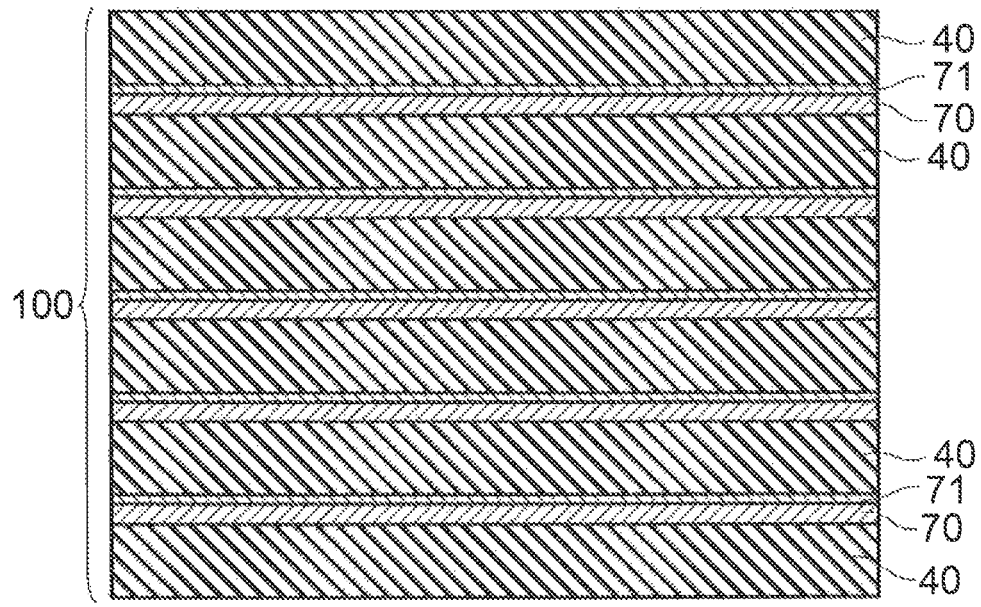
FIGS. 7A and 7B are schematic sectional views of a part of a stacked body of the semiconductor device of the embodiment.

FIG. 7A is a schematic sectional view showing yet another specific example of a part of the stacked body 100.

The intermediate layer 71 is provided between the upper surface of the metal layer 70 and the insulating layer 40 above the metal layer 70, and the intermediate layer 71 is in contact with the upper surface of the metal layer 70. In the example shown in FIG. 7A, the intermediate layer 71 is not provided between the lower surface of the metal layer 70 and the insulating layer 40 under the metal layer 70.

Figure 7B:
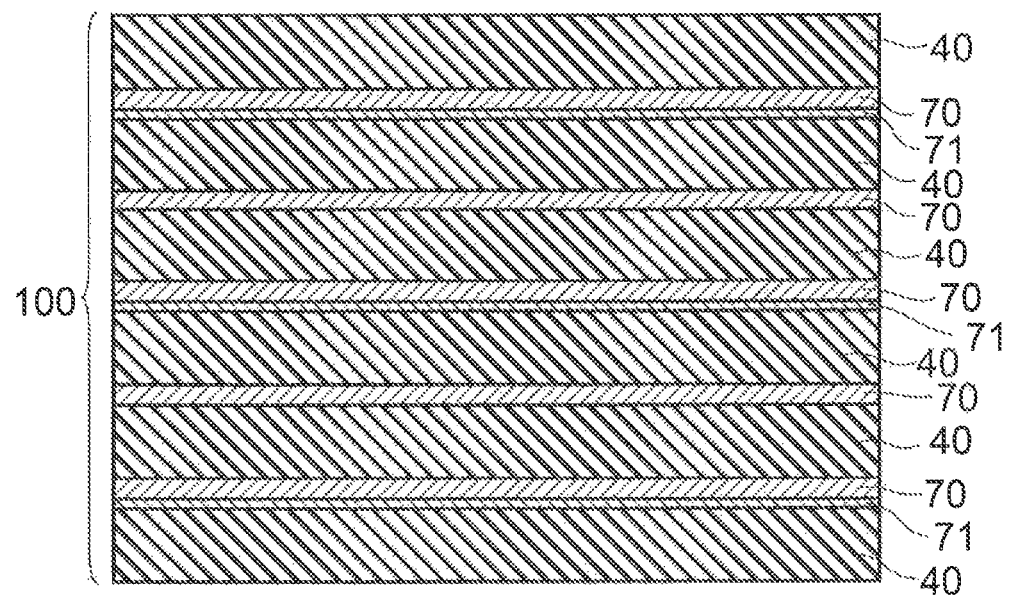

FIG. 7B is a schematic sectional view showing yet another specific example of a part of the stacked body 100.

The intermediate layer 71 is not limited to be provided for each metal layer 70. As shown in FIG. 7B, the stacked body 100 may include the metal layer 70 without the intermediate layer 71 provided on the lower surface of the metal layer 70. Therefore, the number of intermediate layers 71 is smaller than the number of metal layers 70. The arrangement cycle of the intermediate layers 71 in the stacking direction may be periodic or aperiodic.

The number of intermediate layers 71 is made smaller than the number of metal layers 70, and thereby, the thickness of the whole stacked body 100 may be suppressed, and increase of the aspect ratio of the memory holes MH formed in the stacked body 100 may be suppressed. This can facilitate formation of the memory holes MH in desired shapes and sizes. Further, the material and the deposition cost of the intermediate layers 71 may be reduced by reducing the number of intermediate layers 71.

The stacked body 100 shown in FIG. 6 may include the metal layer 70 without the intermediate layers 71 provided on both of the upper and lower surfaces of the metal layer 70. The stacked body 100 shown in FIG. 7A may include the metal layer 70 without the intermediate layer 71 provided on the upper surface of the metal layer 70.

Figure 8:
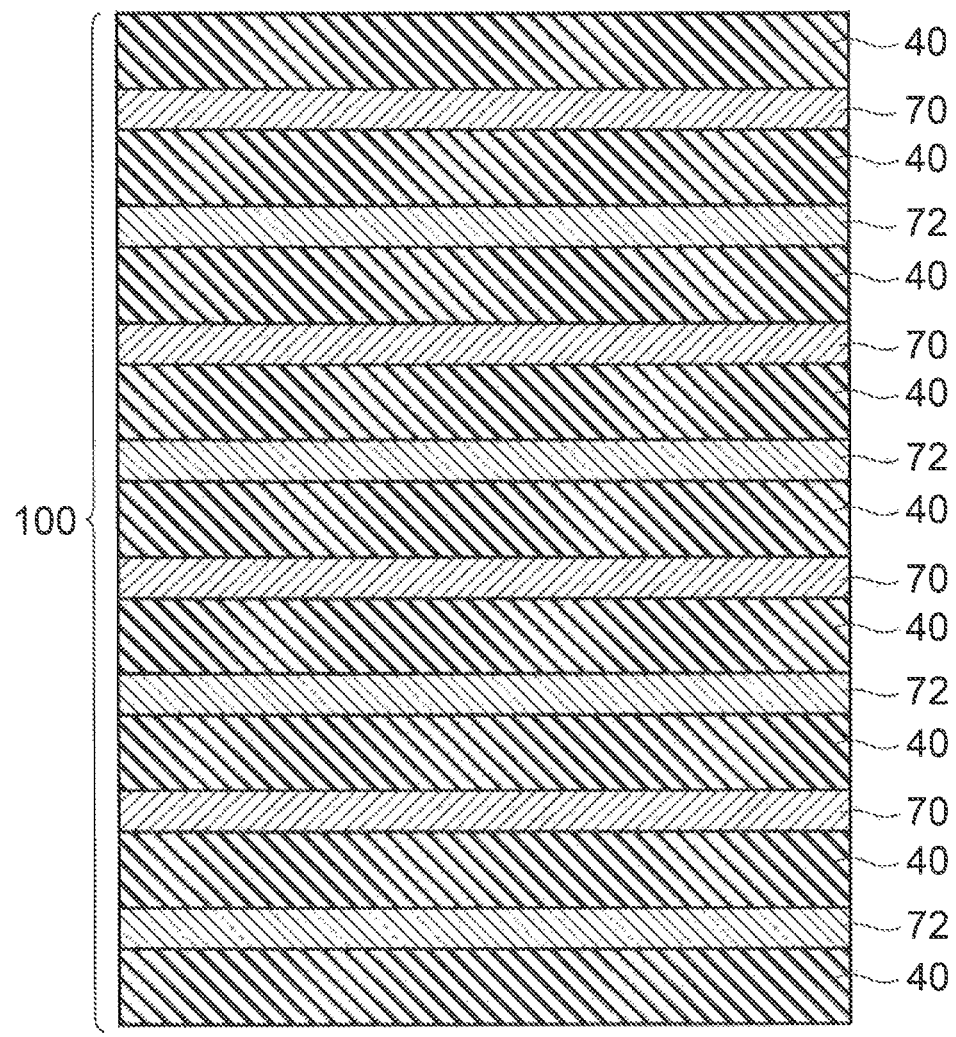
FIG. 8 is a schematic sectional view of a part of a stacked body of the semiconductor device of the embodiment.

FIG. 8 is a schematic sectional view showing yet another specific example of the stacked body 100.

According to the stacked body 100 shown in FIG. 8, an intermediate layer 72 is provided between the insulating layer 40 and the insulating layer 40, and the intermediate layer 72 is not in contact with the metal layer 70.

A plurality of intermediate layers 72 are not connected in the stacking direction of the stacked body 100, and separated from each other in the stacking direction. The intermediate layers 72 are provided in the direction along the major surface of the substrate 10, the intermediate layers 72 are not provided in the direction along the stacking direction of the stacked body 100.

The intermediate layer 72 may be formed using the same material and the same method as those of the above described intermediate layer 71. The intermediate layer 72 is formed to have an internal stress (e.g. compressive stress) as a reversal of an internal stress (e.g. tensile stress) of the metal layer 70 like the above intermediate layer 71. Such intermediate layer 72 suppresses warpage of the wafer.

Further, (Internal stress of metal layer 70×Film thickness of metal layer 70×Total number of metal layers 70)+(Internal stress of insulating layer 40×Film thickness of insulating layer 40×Total number of insulating layers 40)+(Internal stress of intermediate layer 72×Film thickness of intermediate layer 72×Total number of intermediate layer 72) is preferable smaller than 1700000 [MPa·nm] to suppress the amount of warpage (H) of the wafer W to be 100 µm or less.

The metal layers 70 are cyclically stacked in the stacking direction of the stacked body 100. The intermediate layers 72 are also cyclically stacked in the stacking direction of the stacked body 100. For instance, the metal layers 70 and the intermediate layers 72 are alternately provided in the stacking direction.

Figure 9:
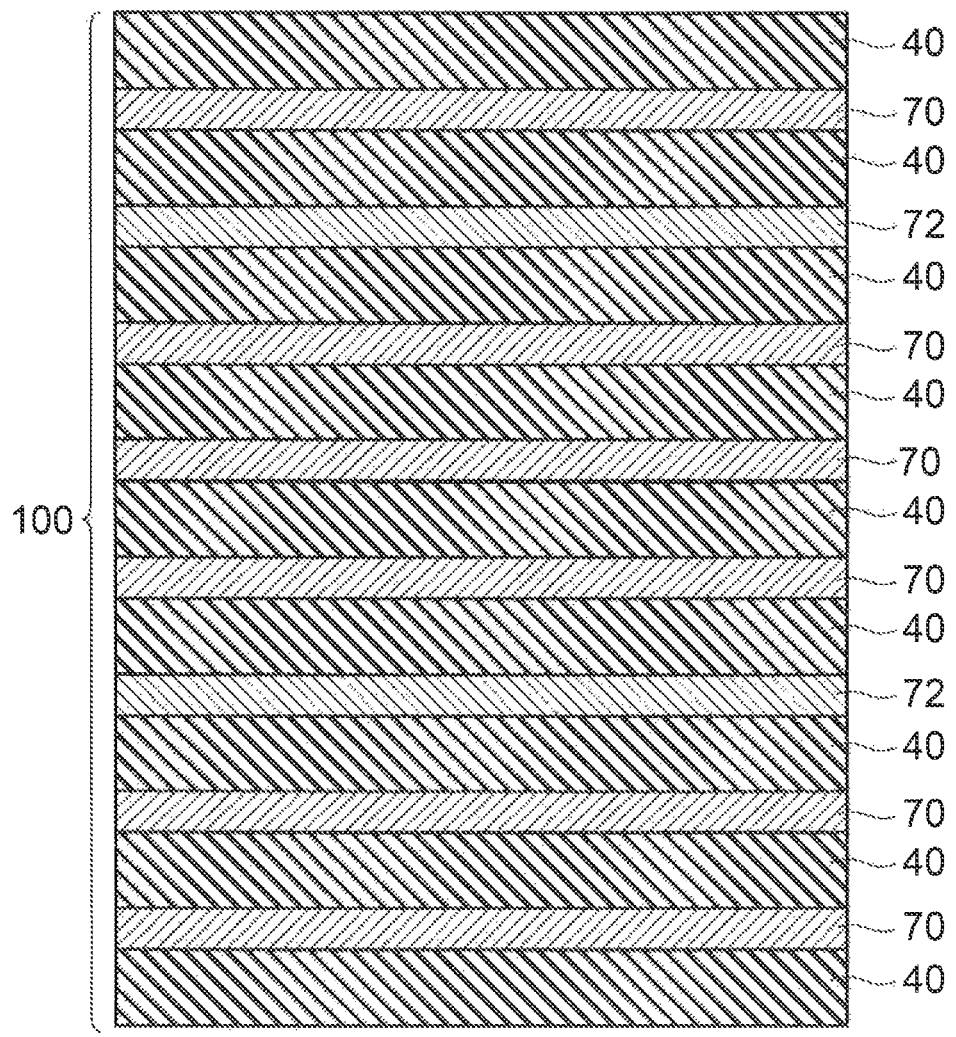
FIG. 9 is a schematic sectional view of a part of a stacked body of the semiconductor device of the embodiment.

FIG. 9 is a schematic sectional view showing yet another specific example of the stacked body 100.

As shown in FIG. 9, the intermediate layers 72 are stacked in the stacking direction with the smaller number of layers than the number of metal layers 70. Two or more metal layers 70 intervene between the intermediate layer 72 and the intermediate layer 72. The intermediate layers 72 are cyclically inserted in the stacking direction. The intermediate layers 72 are not limited to the cyclic arrangement. For instance, insertion frequencies of the intermediate layers 72 may be different between the lower layer side and the upper layer side in response to a tendency of the warpage of the whole wafer.

The number of intermediate layers 72 is made smaller than the number of metal layers 70, and thereby, the thickness of the whole stacked body 100 may be suppressed, and increase of the aspect ratio of the memory holes MH formed in the stacked body 100 may be suppressed. This can facilitate formation of the memory holes MH in desired shapes and sizes. Further, the material and the deposition cost of the intermediate layers 72 may be reduced by reducing the number of intermediate layers 72.

The intermediate layers 72 having conductivity may be used as control electrodes for the memory cells MC and the select transistors STD, STS. In this case, as described above, it is desired to make the resistance of the intermediate layers 72 lower than the resistance of the just-deposited intermediate layers 72 by crystallization, increase in grain size, or nitrogen desorption with heat treatment.

Figure 10:
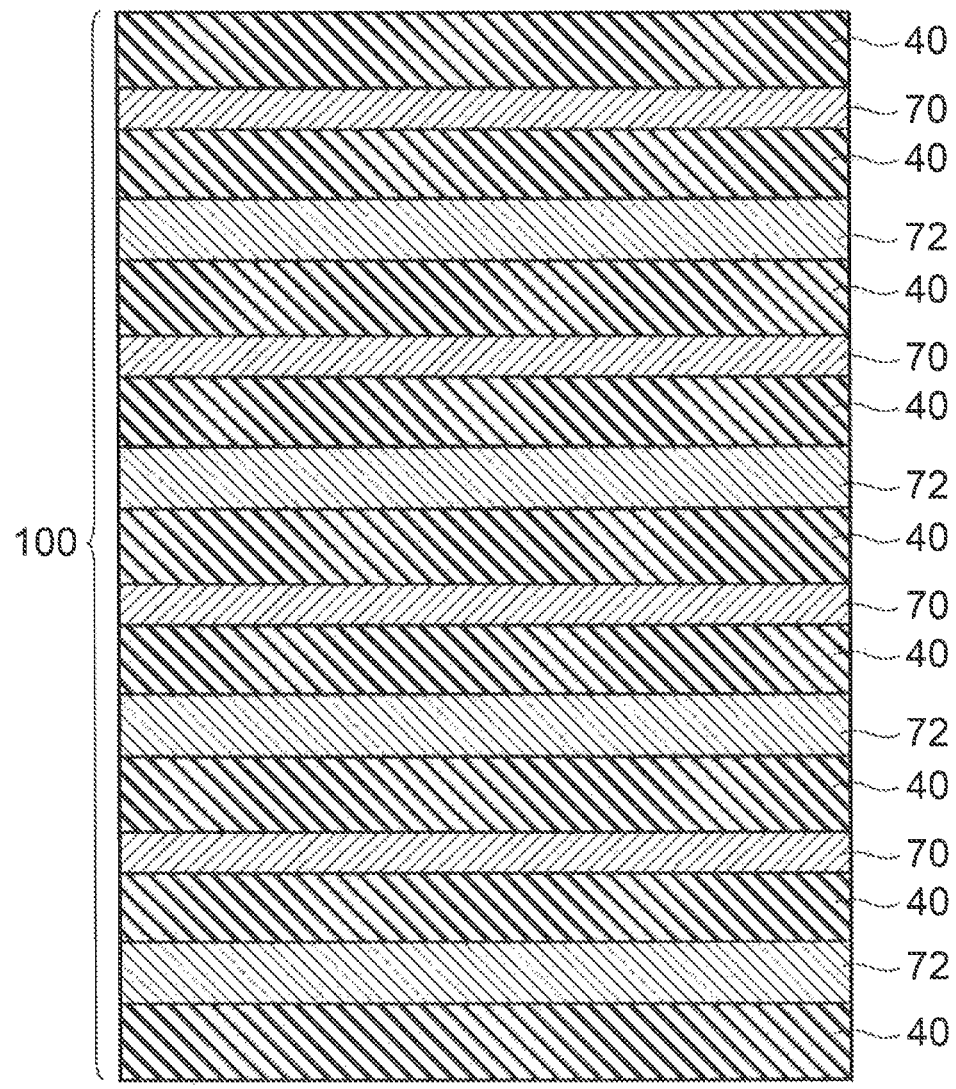
FIG. 10 is a schematic sectional view of a part of a stacked body of the semiconductor device of the embodiment.

FIG. 10 is a schematic sectional view showing yet another specific example of the stacked body 100.

When the resistivity of the intermediate layer 72 is higher than the resistivity of the metal layer 70, as shown in FIG. 10, the thickness of the intermediate layer 72 may be made larger than the thickness of the metal layer 70. The resistance of such a thick intermediate layer 72 is made lower, and the intermediate layer 72 may be used as a control electrode. In the stacked body 100 shown in FIG. 9, the intermediate layer 72 may be formed to be thicker than the metal layer 70.

Figure 11:
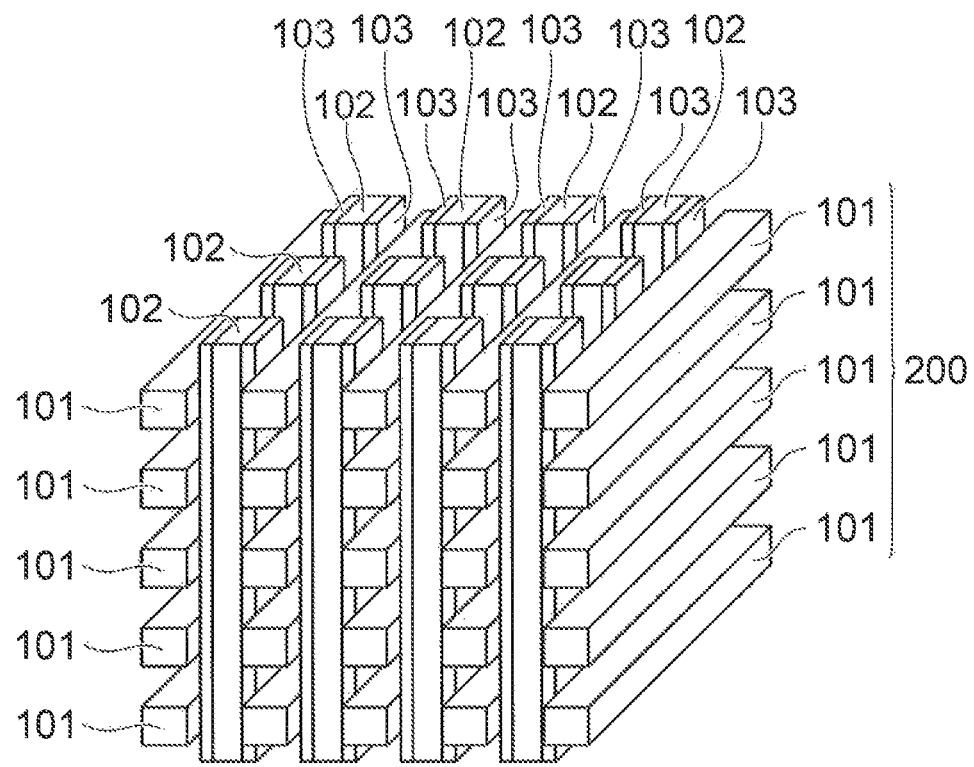
FIG. 11 is a schematic perspective view of a semiconductor device of another embodiment.

FIG. 11 is a schematic perspective view of a semiconductor device of another embodiment.

A stacked body 200 is provided on a substrate (not shown). The stacked body 200 includes a plurality of metal layers 101 stacked in the Z-direction. The plurality of metal layers 101 are separated in the X-direction in one layer, and the respective metal layers 101 extend in the Y-direction. The X-direction, Y-direction, and Z-direction in FIG. 11 are defined to be the same as those in the above described embodiments. The material of the metal layer 101 is the same as that of the metal layer 70 of the above described embodiments.

Conductive films 102 extending in the Z-direction are provided between the metal layer 101 and the metal layer 101 adjacent in the X-direction. A plurality of conductive films 102 are arranged in the Y-direction between the metal layer 101 and the metal layer 101. Insulating films (not shown) are provided between the conductive films 102 adjacent in the Y-direction.

A film 103 including a memory film is provided between the conductive film 102 and the metal layer 101. The film 103 is provided on a side surface, which is opposed to the metal layer 101, of the conductive film 102. The film 103 extends in the Z-direction. The films 103 are separated in the Y-direction. The memory film is e.g. a resistance change film.

The above described intermediate layers 71, 72 shown in FIGS. 3, 6, 7A, 7B, 8, 9, and 10 are provided in the stacked body 200 including the plurality of metal layers 101 shown in FIG. 11, and warpage of the stacked body 200 is relaxed. That is, insulating layers and intermediate layers (not shown) are provided between the plurality of metal layers 101.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
a substrate;

a stacked body including a plurality of metal layers, a plurality of insulating layers, and a plurality of intermediate layers stacked on a major surface of the substrate;

a film having semi-conductivity or conductivity extending in the stacked body in a stacking direction of the stacked body; and a memory film provided between the film and the metal layers, the metal layers being tungsten layers and the intermediate layers being tungsten nitride layers, or the metal layers being molybdenum layers and the intermediate layers being molybdenum nitride layers, the intermediate layer being provided between a lower surface of the metal layer and the insulating layer, the intermediate layer being not provided between an upper surface of the metal layer and the insulating layer, and the intermediate layer being in contact with the metal layer.

2. The device according to claim 1, wherein the intermediate layers are separated from each other in the stacking direction of the stacked body.

3. A semiconductor device comprising:

a substrate;

a stacked body including a plurality of metal layers, a plurality of insulating layers, and a plurality of intermediate layers stacked on a major surface of the substrate;

a film having semi-conductivity or conductivity extending in the stacked body in a stacking direction of the stacked body; and a memory film provided between the film and the metal layers, the metal layers being tungsten layers and the intermediate layers being tungsten nitride layers, or the metal layers being molybdenum layers and the intermediate layers being molybdenum nitride layers, the intermediate layer being provided between an upper surface of the metal layer and the insulating layer, the intermediate layer being not provided between a lower surface of the metal layer and the insulating layer, and the intermediate layer being in contact with the metal layer.

4. The device according to claim 3, wherein the intermediate layers are separated from each other in the stacking direction of the stacked body.

5. A semiconductor device comprising:

a substrate;

a stacked body including a plurality of metal layers, a plurality of insulating layers, and a plurality of intermediate layers stacked on a major surface of the substrate, a number of the intermediate layers being smaller than a number of the metal layers, a direction of an internal stress of the metal layer along the major surface of the substrate and a direction of an internal stress of the intermediate layer along the major surface of the substrate being opposite;

a film having semi-conductivity or conductivity extending in the stacked body in a stacking direction of the stacked body; and a memory film provided between the film and the metal layers.

6. The device according to claim 5, wherein (an internal stress of the metal layer×a film thickness of the metal layer×a total number of the metal layers)+(an internal stress of the insulating layer×a film thickness of the insulating layer×a total number of the insulating layers)+(an internal stress of the intermediate layer×a film thickness of the intermediate layer×a total number of the intermediate layer) is smaller than 1700000 [MPa·nm].

7. The device according to claim 5, wherein the intermediate layers have conductivity.

8. The device according to claim 5, wherein the intermediate layers contain metal nitride.

9. The device according to claim 5, wherein the metal layers are tungsten layers and the intermediate layers are tungsten nitride layers, or the metal layers are molybdenum layers and the intermediate layers are molybdenum nitride layers.

10. The device according to claim 5, wherein the intermediate layer is provided between the metal layer and the insulating layer, and is in contact with the metal layer.

11. The device according to claim 10, wherein the intermediate layer is provided between a lower surface of the metal layer and the insulating layer, and the intermediate layer is not provided between an upper surface of the metal layer and the insulating layer.

12. The device according to claim 10, wherein the intermediate layer is provided between an upper surface of the metal layer and the insulating layer, and the intermediate layer is not provided between a lower surface of the metal layer and the insulating layer.

13. The device according to claim 5, wherein the intermediate layer is provided between the insulating layers, and an upper surface of the intermediate layer and a lower surface of the intermediate layer are in contact with the respective insulating layers.

* * * * *